United States Patent [19]

Botti et al.

[11] Patent Number: 4,714,898

[45] Date of Patent: Dec. 22, 1987

[54] DEVICE FOR PROTECTING THE FINAL STAGE OF A POWER AMPLIFIER AGAINST SHORTING

[75] Inventors: Edoardo Botti, Mortara; Fabrizio Stefani, Cardano al Campo, both of Italy

[73] Assignee: SGS Microelettronica S.p.A., Italy

[21] Appl. No.: 872,081

[22] Filed: Jun. 6, 1986

[51] Int. Cl.$^4$ .............................................. H03F 1/42
[52] U.S. Cl. ................................. 330/298; 330/207 P
[58] Field of Search ...................... 330/2, 207 P, 298; 455/115, 117

[56] References Cited

U.S. PATENT DOCUMENTS 4,644,288  2/1987  Stanley ........................ 330/207 P X
4,644,294  2/1987  Palara et al. ......................... 330/298

Primary Examiner—Eugene R. LaRoche
Assistant Examiner—Steven J. Mottola
Attorney, Agent, or Firm—Jones, Askew & Lunsford

[57] ABSTRACT

A device is disclosed for protecting against shorts the transistors of the push-pull stage in a power amplifier operating on a low voltage supply, in particular for car radio sets. The device comprises sensors which are responsive to currents flowing through the two transistors which form the amplifier push-pull stage, and current-to-voltage converters which convert the sensed currents into corresponding respective voltage signals. The latter are compared in respective voltage-comparing circuits with a reference voltage indicative of the highest admissible current through either of the transistors while the other is shorted. The device also comprises two additional voltage comparators wherein the voltage applied to the load, which may be of a resistive or a reactive type, is compared with a set reference voltage which is lower than or in the extreme equal to, in absolute value, the voltage supply to the amplifier push-pull stage. If the voltages being compared exceed in absolute value the set reference voltages, then the output signals from the comparators energize either of the two bistable circuits to cut off the power supply to the amplifier. The device affords a clear cut between shorted and normal operation conditions, and requires no high current peaks to become operative and activate the protection. After the shorted condition is removed, the device provides automatically for restoring the power supply to the amplifier.

3 Claims, 1 Drawing Figure

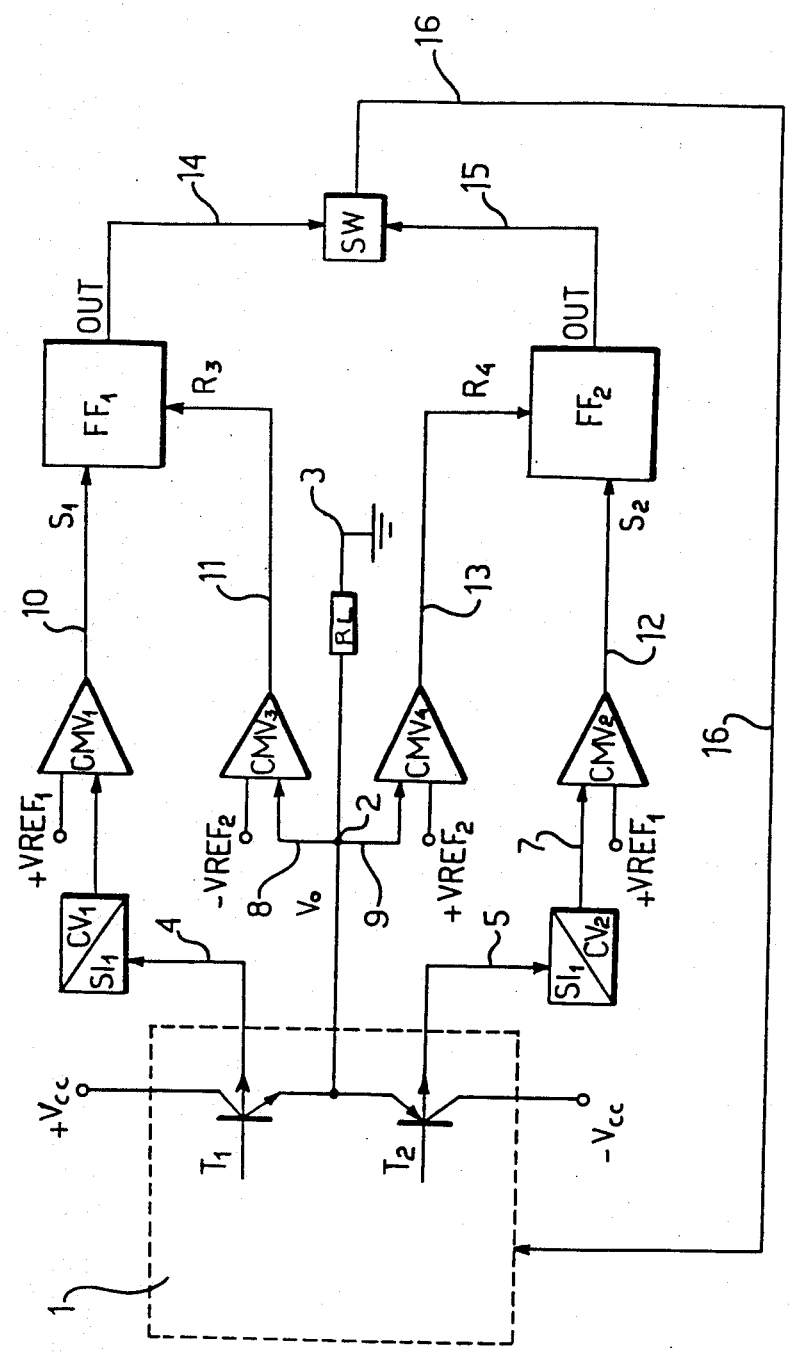

DEVICE FOR PROTECTING THE FINAL STAGE OF A POWER AMPLIFIER AGAINST SHORTING

DESCRIPTION

This invention relates to a device for protection against any shorts which may affect the final stage of low-voltage operated power amplifiers of the type employed, for example, in radio sets on board vehicles.

In particular, the protective device of this invention is useful to protect an amplifier stage of the push-pull type wherein a first transistor is connected with its collector and emitter between the positive pole of the supply voltage and a load terminal, and a second transistor is connected with its collector and emitter between the negative pole of the supply voltage and that same load terminal, the other load terminal being connected to ground.

As is known, such amplifier types are often connected to loads mainly of a resistive character, the resistance whereof may be as low as 2 Ohms or less, to provide for a high power output. Consequently, the current which the amplifier is no supply to the load is notoriously quite high, although not higher than the upper limit current admitted by the transistors that make up the push-pull stage of the amplifier.

In prior art designs, protection of a push-pull type amplifier stage as indicated against shorting is accomplished through a device operative to sense the output current from the amplifier to the load, which device would cut in on that current reaching a set threshold current value close to the maximum admissible current.

That prior protective device falls short of the requisite protection conditions because it may become operative, and block the amplifier, even in normal operating conditions of the amplifier, and in the event of the output to the load being shorted either to the positive or negative pole of the power supply, may give rise to very high and dangerous current peaks for the amplifier final transistors.

Another conventional type of protection is based on the use of a sensor responsive to the appearance across the final stage transistor of a lower potential difference than the circuit least admissible voltage as a result of either the positive or negative pole becoming shorted to the amplifier output.

This prior type of protection involves a risk for the transistors since the small resistance, which would be unavoidably present across the shorting path on account of the high current flowing therethrough, generate across it a potential difference which may exceed the least admissible voltage across the final transistors, and hence, go undetected.

In that case, the short would be there but the protection device fail to perform.

The problem that underlies this invention is, therefore, that of providing protection against shorts for a final stage of a push-pull type amplifier, effective to provide a sharp distinction between normal amplifier operating and shorted conditions without imposing a limitation on the amplifier output current in normal operating conditions thereof.

The problem is solved, according to the invention, by the above-specified device for protecting the final stage of a push-pull amplifier against shorting, which is characterized in that it comprises:

a first current sensor responsive to the current flowing through the first transistor, a second current sensor responsive to the current flowing through the second transistor, respective first and second current-to-voltage converters issuing respective voltage signals indicative of the current values sensed by said first and second sensors, a first voltage comparator for comparing said voltage signal from said first converter with a first set reference positive voltage, a second voltage comparator for comparing said voltage signal from the second converter with said set reference voltage, said first and second voltage comparators being adapted to process and issue respective output signals on either of said voltage signals exceeding said first set reference positive voltage, third and fourth voltage comparators for comparing the instant value of the voltage applied to the load with the negative value and positive value, respectively, of a second set reference voltage, said third and fourth voltage comparators issuing respective output signals according to whether the instant absolute value of the voltage applied to the load exceeds the absolute value of said second set reference voltage, a first bistable circuit to be activated by said output signals from said first and third voltage comparators, if both are provided.

a second bistable circuit to be activated by the output signals from said second and fourth voltage comparators, if both are provided, and a change-over switch connected in in the power supply circuit to the amplifier and controlled by the output signals from either of said bistable circuits.

The invention will be now further described with reference to the accompanying drawing which shows diagramatically a preferred but not exclusive embodiment of a protection device against shorting, according to the invention.

In the drawing, the final stage of the amplifier 1 is shown as comprising transistors $T_1$ and $T_2$ connected in a conventional push-pull scheme. The transistor $T_1$, e.g. of the n-p-n type, is connected with its collector and emitter between the positive pole $+V_{cc}$ of the power supply voltage and the terminal 2 of a load RL the other terminal 3 whereof is grounded conventionally.

The other transistor $T_2$, e.g. of the p-n-p type, is connected with its collector and emitter between the negative pole $-V_{cc}$ of the supply voltage and that same terminal 2 of the load RL.

The bases of the transistors $T_1$ and $T_2$ are connected to the remaining circuitry of the amplifier which are not illustrated here because conventional and foreign to this invention.

According to the invention, the device comprises a first current sensor $SI_1$ which senses, through the diagramatic functional coupling 4, the current flowing through the first transistor $T_1$, and a second current sensor $SI_2$ which senses the current flowing through the transistor $T_2$ by means of the diagramatic functional coupling 5.

With the first current sensor $SI_1$ and the second current sensor $SI_2$, there are associated respective current-to-voltage converters, known per se, which are indicated at $CV_1$ and $CV_2$. The converters $CV_1$ and $CV_2$ are operative to emit respective voltage signals $V_1$ a,d $V_2$ which are indicative of the current values sensed by the sensors $SI_1$ and $SI_2$ at the respective transistors $T_1$ and $T_2$.

The above-mentioned current-to-voltage converters $CV_1$ and $CV_2$ are connected, through respective diagramatic functional couplings 6 and 7, to respective operational voltage-comparing circuits $CMV_1$ and $CMV_2$, wherein the voltage signals $V_1$ and $V_2$ are compared with a first set reference positive voltage $+VREF_1$ which is selected to be indicative of the maximum current Imax to be supplied from one of the transistors $T_1$ or $T_2$ on the other becoming shorted.

The protection device according to the invention further comprises third and fourth operational voltage-comparing circuits which are known per se and indicated at $CMV_3$ and $CMV_4$.

The voltage comparators $CMV_3$ and $CMV_4$ are connected, through respective links 8 and 9, to the terminal 2 of the load RL, thereby sensing the instant value of the voltage Vo applied to the load RL.

The voltage value Vo is compared according to its sign, as will be explained hereinafter, and through either voltage comparator, $CMV_3$ or $CMV_4$, with a second reference voltage $VREF_2$ whose absolute value would not exceed the value of the supply voltage to the amplifier.

The comparators $CMV_1$ and $CMV_3$ are connected, through respective lines 10 and 11, to a first bistable circuit of flip-flop $FF_1$, whilst the voltage comparators $CMV_2$ and $CMV_4$ are connected, through respective lines 12 and 13, to a second bistable circuit or flip-flop $FF_2$.

The outputs of the flip-flop $FF_1$ and $FF_2$ are connected, through respective lines 14 and 15, to a change-over switch SW which is in turn connected, through the diagramatic functional coupling 16, in the power supply circuit to the amplifier 1.

The inventive device operates as follows.

Assuming that the transistor $T_2$ is shorted, the sensor $SI_1$ would sense the current flowing through the transistor $T_1$. That current is converted into a corresponding voltage signal by the converter $CV_1$, and the voltage signal $V_1$ issuing therefrom is supplied, through the link 6, to the voltage comparator $CMV_1$, wherein it will be compared with the reference voltage $+VREF_1$.

Since the reference voltage $VREF_1$ represents the current value Imax that can be supplied from the transistor $T_1$ in the event of a short in the amplifier, if the voltage signal $V_1$ reads higher than that reference voltage, then the comparator $CMV_1$ will issue an output signal $S_1$ which is supplied, over the line 10, to the flip-flop $FF_1$.

The reference voltage $+VREF_1$ which represents, as mentioned, the permissible current from the transistors in the event of a short in the amplifier, may be selected to represent a current value which is distinctly higher than the maximum current to be supplied from the push-pull stage to the load in normal operating conditions. Thus, the protection device is prevented from being triggered, as is the case with conventional devices, even in the presence of high load currents due to normal operating condition factors.

In the above-described situation, the flip-flop $FF_1$ would not to be put as yet in a condition to act on the switch SW; in fact, a further concition would have to be met. If, as outlined above, the short occurred at the transistor $T_2$, the potential at the node 2 will tend to acquire the same potential as the negative pole of the power supply $-Vcc$.

The actual voltage appearing at that node is applied, through the link 8, to the comparator $CMV_3$ wherein it is compared with the negative value $-VREF_2$ of the second reference voltage. The latter reference voltage is selected no higher in absolute value than the value of the amplifier supply voltage Vcc.

Should, on comparing the voltage Vo with the second reference voltage $VREF_2$, the absolute value of the former exceed the absolute value of the latter—in the example illustrated should $Vo < -VREF_2$—then on the comparator $CMV_3$ output there would appear a signal $R_3$ which is passed to the flip-flop $FF_1$ through the link 11.

In the presence of both the signals $S_1$ and $R_3$, the flip-flop $FF_1$ will change its state. Its output signal will control, through the link 14, operation of the switch SW, which acts, in turn, on the power supply to the amplifier 1 through the link 16 to either turn it off or bring it to a wait condition.

The state of the flip-flop $FF_1$ would remain unchanged even in the absence of the signal $S_1$ related to the current as a result of the current supply dropping to zero on account, for example, of the amplifier current sources being switched off due to the shorted condition continuing. The flip-flop $FF_1$ will, in fact, go over into the other state, thus energizing the amplifier through the change-over switch SW, only on receiving a reset command which, in the example shown, would occur on the voltage $V_o$ dropping below the reference voltage $VREF_2$, that is on the shorted condition being removed. A similar operation mode would take place in the event that the shorted condition affects the transistor $T_1$. In that case, on the condition being met whereby the current flowing through the transistor $T_2$ exceeds the maximum admissible current, to which the first reference voltage $VREF_1$ corresponds, and the voltage Vo at the load RL exceeds the positive value $+VREF_2$ of the second reference value, the output signal $S_2$ from the comparator $CMV_2$ and output signal $R_4$ from the voltage comparator $CMV_4$ would trigger the bistable circuit $FF_2$ into operation, and hence, drive the switch SW through the link 15.

It may be appreciated from the foregoing description that the inventive protection device against shorting operates in a condition of clear separation of the shorted from the normal operating conditions, and imposes no limitations on the amplifier output current while the latter is operating properly.

This device may be also employed with a partly reactive load RL, it only requiring in this case, as the skilled one will readily recognize, that an appropriate selection be made of the values for the first reference voltage $VREF_1$ which is linked to the admissible current Imax through the transistors in the event of shorts occurring, and for the second reference voltage $VREF_2$ in order to avoid undesired cutting in of the protection device.

The material and components for the device may be selected contingent on specific constructional requirements without departing from the protection scope hereof as set forth in the appended claims.

We claim:

1. Apparatus for protecting the final stage of a power amplifier operating on a low voltage supply against shorting, the low voltage supply having a positive pole ($+Vcc$) and a negative pole ($-Vcc$), said final stage being of the push-pull type which comprises a first transistor ($T_1$) connected between the positive pole ($+Vcc$) of the supply voltage and a terminal of the load (RL), and a second transistor ($T_2$) connected between the negative pole ($-Vcc$) of the supply voltage and said terminal of the load (RL), another terminal of the load being grounded, characterized in that the apparatus comprises a first current sensor ($SI_1$) responsive to current flowing through the first transistor ($T_1$), and a second current sensor ($SI_2$) responsive to current flowing through the second transistor ($T_2$), respective first ($CV_1$) and second ($CV_2$) current-to-voltage converters issuing respective voltage signals ($V_1$, $V_2$) indicative of the current values sensed by said sensors ($SI_1$, $SI_2$), a first voltage comparator ($CMV_1$) for comparing said voltage signal ($V_1$) from the first converter ($CV_1$) with a first set reference positive voltage ($+VREF_1$), a second voltage comparator ($CMV_2$) for comparing said voltage signal ($V_2$) from the second converter ($CV_2$) with said set reference voltage ($+VREF_1$), said first and second voltage comparators being adapted to process and issue respective output signals ($S_1$, $S_2$) on either of said voltage signals ($V_1$ or $V_2$) exceeding said positive set reference voltage ($+VREF_1$), third ($CMV_3$) and forth ($CMV_4$) voltage comparators for comparing the instant value ($V_o$) applied to the load (RL) with the negative value and positive value, respectively, of a second set reference voltage ($VREF_2$), said third and fourth voltage comparators ($CMV_3$, $CMV_4$) issuing respective output signals ($R_3$, $R_4$) according to whether the instant absolute value of the voltage ($V_o$) applied to the load (RL) exceeds the absolute value of said second set reference voltage ($VREF_2$), a first bistable circuit ($FF_1$) to be activated by the output signals ($S_1$, $R_3$) from said first ($CMV_1$) and said third ($CMV_3$) voltage comparators, where both are provided, a second bistable circuit ($FF_2$) to be activated by the output signals ($S_2$, $R_4$) from said second ($CMV_2$) and said fourth ($CMV_4$) voltage comparators, and a change-over switch (SW) connected in circuit to the amplifier (1) and controlled by the output signals from either of said bistable circuits.

2. A device according to claim 1, characterized in that the value of said first set reference voltage ($+VREF_1$) for the first and second voltage comparators is indicative of the value of the maximum current ($Imax$) to be supplied by either of the transistors ($T_1$, $T_2$) in the amplifier push-pull stage in the event of the other of the transistors becoming shorted.

3. A device according to claim 1, characterized in that the absolute value of said second set reference voltage ($VREF_2$) for the third and fourth voltage comparators is no higher than the value of the supply voltage to the final stage of the amplifier.

* * * * *